(12) United States Patent
Kubo et al.

(10) Patent No.: US 11,374,270 B2
(45) Date of Patent: Jun. 28, 2022

(54) VEHICLE, DETERIORATION EVALUATION DEVICE FOR SECONDARY BATTERY, AND DETERIORATION EVALUATION METHOD FOR SECONDARY BATTERY

(71) Applicant: TOYOTA JIDOSHA KABUSHIKI KAISHA, Toyota (JP)

(72) Inventors: Kazuki Kubo, Toyota (JP); Yoshihiro Uchida, Nagakute (JP); Junta Izumi, Nagoya (JP); Masaki Uchiyama, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 414 days.

(21) Appl. No.: 16/531,626

(22) Filed: Aug. 5, 2019

(65) Prior Publication Data

US 2020/0127343 A1 Apr. 23, 2020

(30) Foreign Application Priority Data

Oct. 19, 2018 (JP) .............................. JP2018-197633

(51) Int. Cl.
*H01M 10/48* (2006.01)
*G01R 31/392* (2019.01)
(Continued)

(52) U.S. Cl.
CPC ...... *H01M 10/488* (2013.01); *G01R 31/3646* (2019.01); *G01R 31/392* (2019.01);
(Continued)

(58) Field of Classification Search
CPC ............. H01M 2220/20; H01M 10/00; H01M 10/0488; H01M 2010/4271; H01M 2010/4278; H01M 2010/4285; H01M 2010/4292; H01M 10/48; H01M 10/482; H01M 10/488; B60Y 2200/92; B60Y 2200/90; B60Y 2200/91; B60Y 2200/912; B60Y 2304/00; B60Y 2304/09; B60Y 2400/11; B60Y 2400/112; B60K 6/28;
(Continued)

(56) References Cited

U.S. PATENT DOCUMENTS 9,146,280 B2 * 9/2015 Sun .................... G01R 31/3835
2014/0032102 A1 1/2014 Egoshi
(Continued)

FOREIGN PATENT DOCUMENTS

DE 102005026583 A1 12/2006
JP 2016-215836 A 12/2016
(Continued)

*Primary Examiner* — Anthony R Jimenez
(74) *Attorney, Agent, or Firm* — Sughrue Mion, PLLC

(57) ABSTRACT

A vehicle includes a secondary battery and a display device. The secondary battery is mounted on the vehicle as a power source. The display device is configured to display an indicator that indicates a capacity retention rate of the secondary battery at a current point in time. The capacity retention rate is a ratio of a capacity of the secondary battery at the current point in time to a reference capacity of the secondary battery. The reference capacity is set in advance based on a virtual capacity of the secondary battery after a lapse of a predetermined period from manufacture of the vehicle.

4 Claims, 5 Drawing Sheets

(51) Int. Cl.
  *G01R 31/36* (2020.01)
  *B60L 58/12* (2019.01)
  *B60K 6/28* (2007.10)

(52) U.S. Cl.
  CPC .................. *B60K 6/28* (2013.01); *B60L 58/12* (2019.02); *B60Y 2200/92* (2013.01); *H01M 2220/20* (2013.01)

(58) Field of Classification Search
  CPC .......... B60L 58/12; B60L 58/00; B60L 58/10; B60L 58/16; B60L 58/18; G01R 31/00; G01R 31/392; G01R 31/3646; G01R 31/01; G01R 31/12; G01R 31/59; G01R 31/2642; G01R 31/36; G01R 31/364; G01R 31/3644; G01R 31/367; G01R 31/374; G01R 31/378; G01R 31/382; G01R 31/385; G01R 31/389; G01R 35/00
  USPC .......................................................... 429/90
  See application file for complete search history.

(56) References Cited

U.S. PATENT DOCUMENTS

| | | | |
|---|---|---|---|
| 2015/0188198 A1 | 7/2015 | Bonhomme et al. | |
| 2018/0050601 A1 | 2/2018 | Katanoda | |

FOREIGN PATENT DOCUMENTS

| | | |
|---|---|---|
| JP | 2017-28874 A | 2/2017 |
| JP | 2018-029430 A | 2/2018 |

\* cited by examiner

VEHICLE, DETERIORATION EVALUATION DEVICE FOR SECONDARY BATTERY, AND DETERIORATION EVALUATION METHOD FOR SECONDARY BATTERY

INCORPORATION BY REFERENCE

The disclosure of Japanese Patent Application No. 2018-197633 filed on Oct. 19, 2018 including the specification, drawings and abstract is incorporated herein by reference in its entirety.

BACKGROUND

1. Technical Field

The disclosure relates to a vehicle, a deterioration evaluation device for a secondary battery, and a deterioration evaluation method for a secondary battery.

2. Description of Related Art

Secondary batteries are mounted on vehicles, such as hybrid vehicles and electric vehicles, as drive sources (power sources) for motors. It is known that secondary batteries deteriorate with time and the internal resistances of secondary batteries increase or the full charge capacities of secondary batteries reduce. Therefore, various techniques for estimating the states of deterioration of secondary batteries have been suggested. For example, Japanese Unexamined Patent Application Publication No. 2018-029430 (JP 2018-029430 A) describes a technique for raising the accuracy of estimating the states of deterioration of secondary batteries.

SUMMARY

When the deterioration of secondary batteries progresses and the full charge capacities of the secondary batteries reduce, the ranges that vehicles can travel on the electric power stored in the secondary batteries (so-called EV ranges) reduce. When the full charge capacities of secondary batteries reduce, the electric power that can be recovered through regenerative control during travel reduces, so this may lead to the deterioration of fuel consumption in hybrid vehicles. Therefore, as the deterioration of secondary batteries progresses, the values of the vehicles decrease. Hence, the states of deterioration of secondary batteries are matters of serious concern not only for users but also for makers of vehicles (or dealers, or the like, of used vehicles).

The capacity retention rates of secondary batteries are often used as indicators that indicate the states of deterioration of the secondary batteries. Generally, the capacity retention rate of a secondary battery is expressed by the ratio of the full charge capacity of the secondary battery at a current point in time to the full charge capacity of the secondary battery in an initial state (at the time when the secondary battery is manufactured).

The full charge capacities of secondary batteries in initial states can vary among vehicles because of production tolerances or other factors of the secondary batteries. For this reason, when the capacity retention rates of secondary batteries are compared among a plurality of vehicles, even when the capacity retention rates indicate the same value, the full charge capacities of the secondary batteries after deterioration can be different from one another. For this reason, the states of deterioration of secondary batteries (in other words, the values of vehicles) may not be accurately evaluated based on the capacity retention rates of the secondary batteries.

The disclosure provides a vehicle, a deterioration evaluation device for a secondary battery, and a deterioration evaluation method for a secondary battery, which are able to accurately evaluate the state of deterioration of a secondary battery.

(1) A first aspect of the disclosure relates to a vehicle. The vehicle includes a secondary battery and a display device. The secondary battery is mounted on the vehicle as a power source. The display device is configured to display an indicator that indicates a capacity retention rate of the secondary battery at a current point in time. The capacity retention rate is a ratio of a capacity of the secondary battery at the current point in time to a reference capacity of the secondary battery. The reference capacity is set in advance based on a virtual capacity of the secondary battery after a lapse of a predetermined period from manufacture of the vehicle.

(2) The predetermined period may be set to longer than a period that is assumed until delivery of the vehicle to a user from the manufacture of the vehicle. The reference capacity may be set based on a capacity of the secondary battery after a lapse of the predetermined period from the manufacture of the vehicle on a reference capacity curve that indicates a decrease in the capacity of the secondary battery with time.

With the configurations of the above (1) and (2), instead of the capacity retention rate of the secondary battery, the capacity retention rate that is the ratio of a capacity of the secondary battery at a current point in time to the reference capacity is used. That is, the capacity retention rate is calculated by using the reference capacity common to all the vehicles. When the reference is uniformized in this way, the magnitude relation of the capacity retention rate coincides with the magnitude relation of the capacity, so the state of deterioration of a secondary battery is accurately evaluated through comparison based on the capacity retention rate.

(3) The display device may be configured to, before the capacity of the secondary battery reaches the reference capacity, display the indicator that indicates that the capacity retention rate of the secondary battery is a maximum.

(4) The display device may be configured to, after the capacity of the secondary battery reaches the reference capacity, display the indicator that indicates that a decrease in the capacity retention rate of the secondary battery progresses.

When the capacity retention rate of a secondary battery is lower than 100% at the point in time at which the predetermined period has elapsed (that is, at the time of delivery of the vehicle to a user), the user may experience a feeling of strangeness that the battery has deteriorated from the time of delivery although the user purchased a new vehicle. With the configurations of (3) and (4), a user does not see a decrease in capacity retention rate (value lower than 100%) at the time of delivery of the vehicle, so a feeling of strangeness of the user is reduced.

(5) A second aspect of the disclosure relates to a deterioration evaluation device for a secondary battery. The secondary battery is mounted on the vehicle as a power source. The deterioration evaluation device includes a display unit. The display unit is configured to display an indicator that indicates a capacity retention rate of the secondary battery at a current point in time. The capacity retention rate is a ratio of a capacity of the secondary battery at the current point in time to a reference capacity of the secondary battery. The reference capacity is set in advance based on a virtual capacity of the secondary battery after a lapse of a predetermined period from manufacture of the vehicle.

With the configuration of (5), as in the case of the configuration of (1), the state of deterioration of the secondary battery is accurately evaluated.

(6) A third aspect of the disclosure relates to a deterioration evaluation method for a secondary battery. The secondary battery is mounted on the vehicle as a power source. The deterioration evaluation method includes setting a reference capacity of the secondary battery based on a capacity of the secondary battery after a lapse of a predetermined period from manufacture of a vehicle, and displaying an indicator that indicates a capacity retention rate of the secondary battery at a current point in time, the capacity retention rate being a ratio of a capacity of the secondary battery at the current point in time to the reference capacity of the secondary battery.

With the method of (6), as in the case of the configuration of (1), the state of deterioration of the secondary battery is accurately evaluated.

According to the aspects of the disclosure, the state of deterioration of the secondary battery is accurately evaluated.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Figure 1:
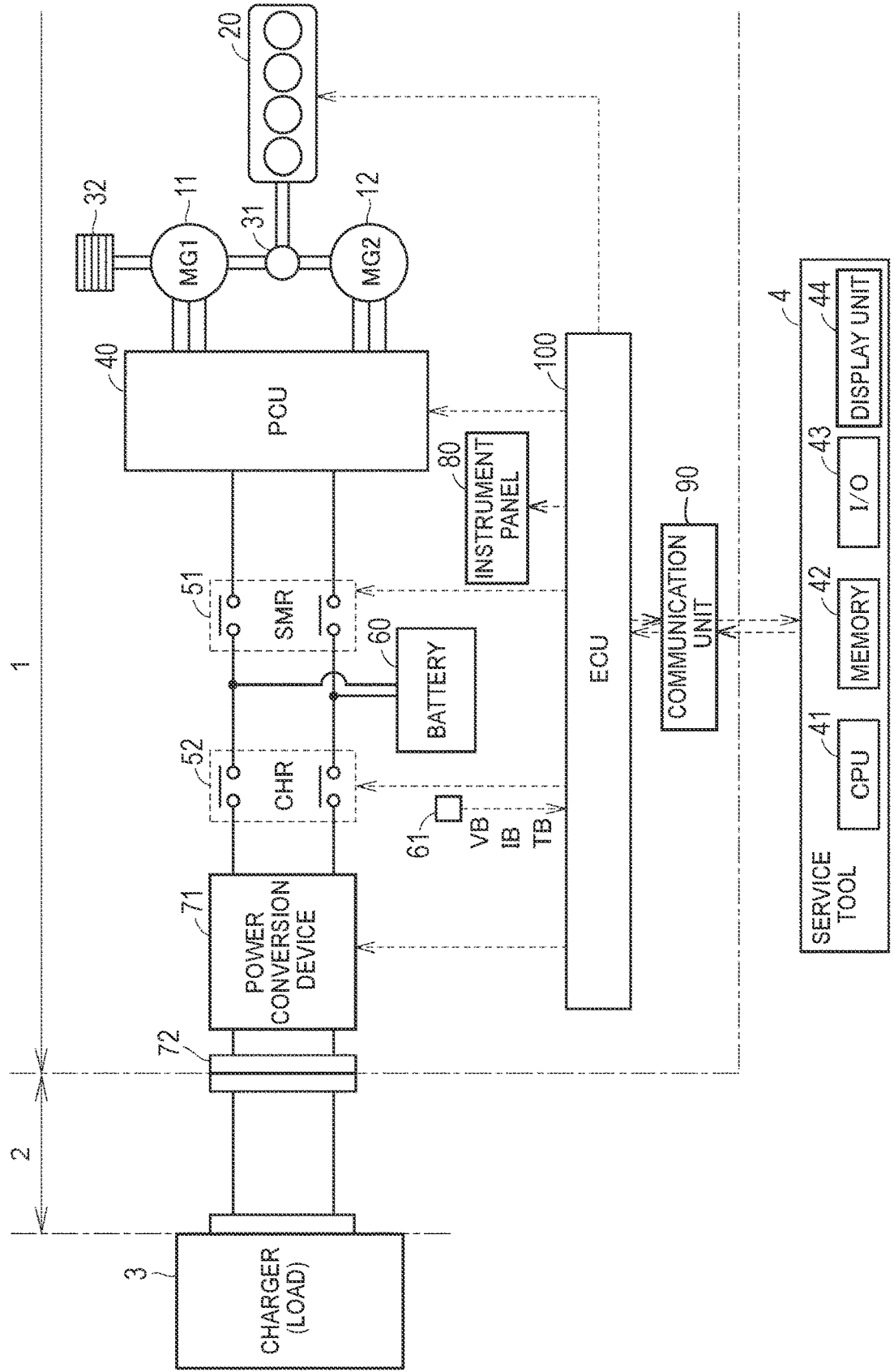
FIG. 1 is a diagram that schematically shows the overall configuration of a system including a vehicle according to an embodiment of the disclosure.

Hereinafter, an embodiment will be described in detail with reference to the accompanying drawings. Like reference signs denote the same or corresponding portions in the drawings, and the description thereof will not be repeated.

In the embodiment that will be described below, a vehicle according to the disclosure is a plug-in hybrid vehicle configured to be able to charge an in-vehicle battery with electric power that is supplied from a charger (charging facility) provided outside the vehicle (plug-in charge) as an example. However, the vehicle according to the disclosure just needs to be equipped with a battery that serves as a power source, and may be an ordinary hybrid vehicle (that is not configured to be chargeable from the outside) or may be an electric vehicle or may be a fuel cell vehicle.

Embodiment

Overall Configuration of System

FIG. 1 is a diagram that schematically shows the overall configuration of a system including a vehicle according to the present embodiment of the disclosure. As shown in FIG. 1, the vehicle 1 is configured to be electrically connectable to a charger 3 (or a load outside the vehicle) by a charging cable 2, and is configured to be communicable with a service tool 4. The service tool 4 is an exclusive terminal installed at a dealer, a repair shop, or the like, and is used to diagnose whether the vehicle 1 has an abnormality (including the state of deterioration of a battery).

The vehicle 1 includes motor generators 11, 12, an engine 20, a power split device 31, a drive wheel 32, a power control unit (PCU) 40, a system main relay (SMR) 51, a charging relay 52, a battery 60, a monitoring unit 61, a power conversion device 71, an inlet 72, an instrument panel 80, a communication unit 90, and an electronic control unit (ECU) 100.

Each of the motor generators 11, 12 is, for example, a three-phase alternating-current rotating electrical machine in which permanent magnets are embedded in a rotor (not shown). The motor generator 11 is coupled to the crankshaft of the engine 20 via the power split device 31. The motor generator 11 rotates the crankshaft of the engine 20 by using the electric power of the battery 60 at start-up of the engine 20. The motor generator 11 is also able to generate electric power by using the power of the engine 20. The alternating-current power generated by the motor generator 11 is converted to direct-current power by the PCU 40, and the battery 60 is charged with the direct-current power. The alternating-current power generated by the motor generator 11 can be supplied to the motor generator 12.

The motor generator 12 rotates a drive shaft by using at least one of the electric power from the battery 60 and the electric power generated by the motor generator 11. The motor generator 12 is also able to generate electric power through regenerative braking. The alternating-current power generated by the motor generator 12 is converted to direct-current power by the PCU 40, and the battery 60 is charged with the direct-current power.

The engine 20 is an internal combustion engine, such as a gasoline engine and a diesel engine, and generates power for propelling the vehicle 1 in response to a control signal from the ECU 100.

The power split device 31 is, for example, a planetary gear train, and splits the power generated by the engine 20 into the power that is transmitted to the drive wheel 32 and the power that is transmitted to the motor generator 11.

The PCU 40, in response to a control signal from the ECU 100, converts the direct-current power stored in the battery 60 to alternating-current power and supplies the alternating-current power to the motor generator 11 or the motor generator 12. The PCU 40 also converts the alternating-current power generated by the motor generator 11 or the motor generator 12 to direct-current power and supplies the direct-current power to the battery 60.

The SMR 51 is electrically connected to power lines that connect the PCU 40 and the battery 60. The SMR 51 switches between supply and interruption of electric power between the PCU 40 and the battery 60 in response to a control signal from the ECU 100.

The charging relay 52 is electrically connected to power lines that connect the battery 60 and the power conversion device 71. The charging relay 52 switches between supply and interruption of electric power between the battery 60 and the power conversion device 71 in response to a control signal from the ECU 100.

The battery 60 is a direct-current power source configured to be chargeable and dischargeable. A secondary battery, such as a lithium ion secondary battery and a nickel-metal hydride battery, may be used as the battery 60. The battery 60 supplies the PCU 40 with electric power for generating the driving force of the vehicle 1. The battery 60 also stores the electric power generated by the motor generator 11.

The monitoring unit 61 monitors the status of the battery 60. Specifically, the monitoring unit 61 includes a voltage sensor, a current sensor, and a temperature sensor (each of which is not shown). The voltage sensor detects the voltage VB of the battery 60. The current sensor detects the current IB that is input to or output from the battery 60. The temperature sensor detects the temperature sensor TB of the battery 60. The sensors output signals that represent detected information to the ECU 100.

The power conversion device 71 includes, for example, an AC-DC converter (not shown). The power conversion device 71 converts the alternating-current power that is supplied from the charger 3 via the charging cable 2 and the inlet 72 to direct-current power and outputs the direct-current power to the charging relay 52.

The instrument panel 80 is an instrument panel on which meters are placed. The instrument panel 80 provides a user with various conditions of the vehicle 1 under control of the ECU 100.

The communication unit 90 is configured to be bidirectionally communicable with the service tool 4 by wired or wireless connection. The communication unit 90 may be configured to be communicable with a server (not shown) provided outside the vehicle 1.

The ECU 100 is made up of a central processing unit (CPU), a memory, and an input/output port (each of which is not shown). The ECU 100 outputs control signals based on the signals input from the sensors and the maps and programs stored in the memory, and controls devices such that the vehicle 1 is placed in a desired state. One major control that is executed by the ECU 100 in the present embodiment is deterioration display processing. The deterioration display processing causes the instrument panel 80 to display an indicator that indicates the state of deterioration of the battery 60. The deterioration display processing will be described in detail later.

The service tool 4, as in the case of the ECU 100, includes a CPU 41 (calculation unit), a memory 42, an input/output port 43, and a display unit 44. The service tool 4, in accordance with an operation made by an operator at a dealer or the like, diagnoses whether the vehicle 1 has a malfunction as described above, estimates the state of deterioration of the battery 60, or sets various parameters of the vehicle 1. The service tool 4 may be regarded as a deterioration evaluation device for a secondary battery according to the disclosure.

Figure 2:
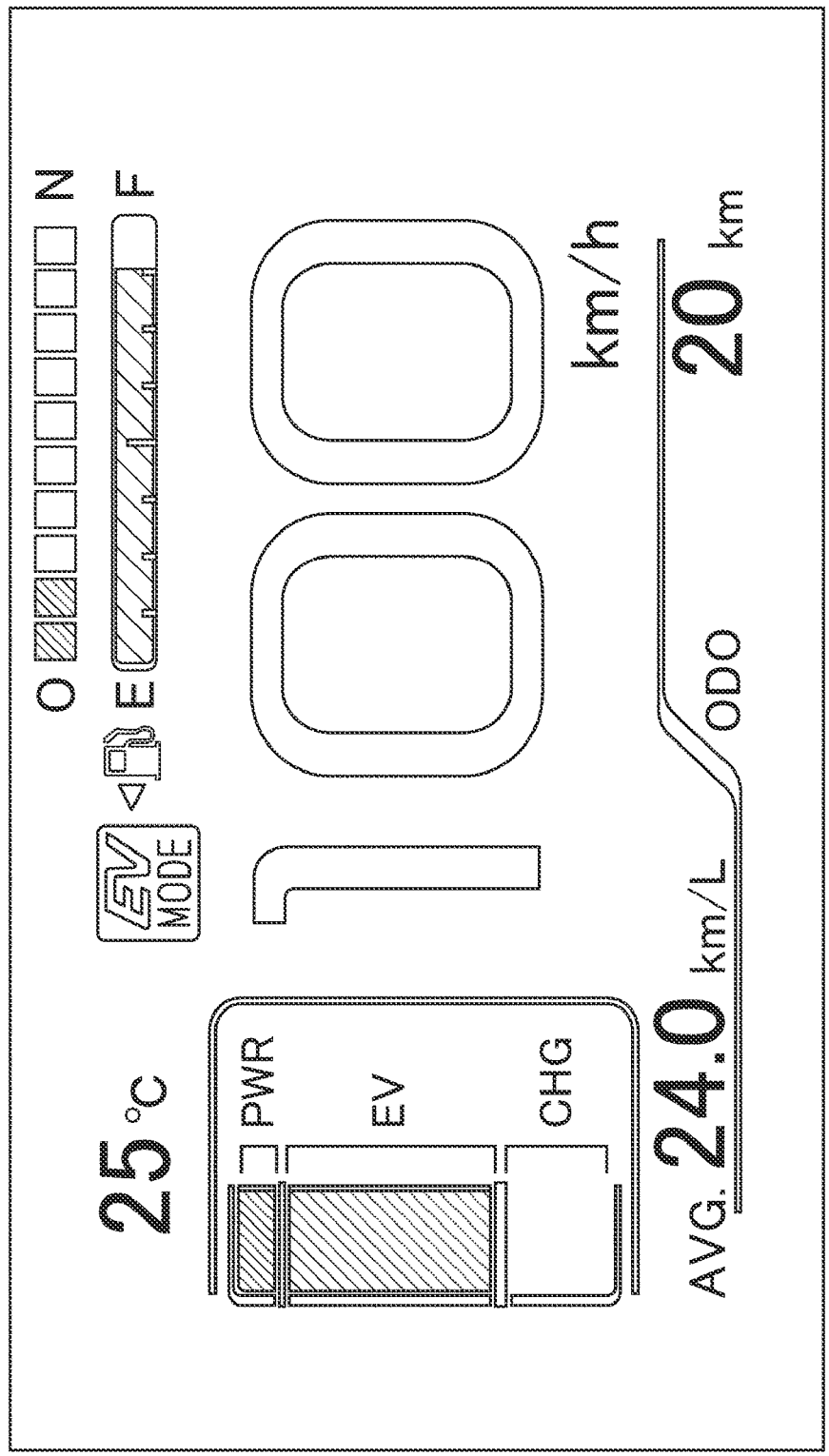
FIG. 2 is a view that shows an example of a mode of display on an instrument panel.

FIG. 2 is a view that shows an example of the mode of display on the instrument panel 80. As shown in FIG. 2, the kilometers per hour (100 km/h is illustrated), average fuel consumption (24.0 km/L), travel distance (20 km), outside air temperature (25° C.), fuel level, and other information, of the vehicle 1 are displayed on the instrument panel 80.

The instrument panel 80 is configured to display, in addition to the above-described parameters, display icons (meter) in number set according to the capacity retention rate (described in detail later) of the battery 60 as shown at the top right portion. In the example shown in FIG. 2, the number of icons in a state where the battery 60 has not deteriorated is ten, and the number of icons reduces as the deterioration of the battery 60 progresses. When the number of icons is less than or equal to two, the deterioration of the battery 60 has considerably progressed, and such the number of icons means that replacement of the battery 60 needs to be considered. Although not shown in the drawing, the instrument panel 80 may display the capacity retention rate of the battery 60 in numeric value (percent).

The instrument panel 80 may be regarded as a display device according to the disclosure. However, the display device according to the disclosure is not limited to the instrument panel 80. The display device may be a liquid crystal display (not shown) of a car navigation system, or another display.

Decrease in Full Charge Capacity

Figure 3:
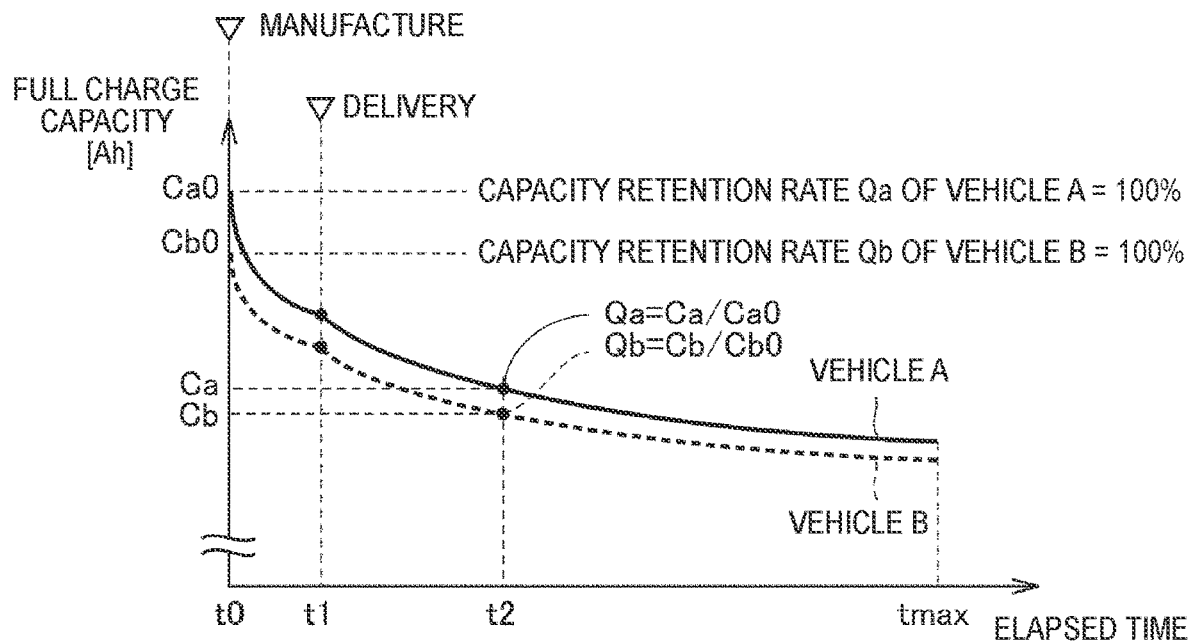
FIG. 3 is a graph for illustrating an example of changes in the full charge capacity of a battery with time.
Figure 4:
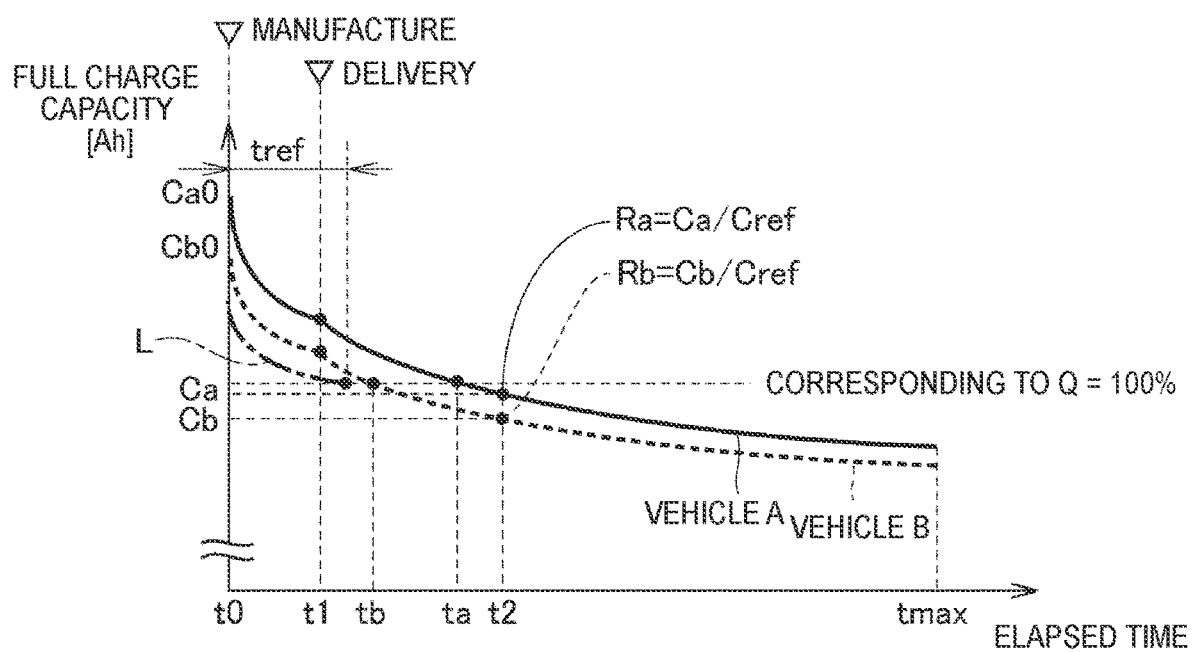
FIG. 4 is a graph for illustrating a technique for calculating the capacity retention rate of a battery in the present embodiment.

Generally, when the deterioration of batteries progresses and the full charge capacities of the batteries reduce, the ranges that vehicles can travel on the electric power stored in the batteries (so-called EV ranges) reduce. When the full charge capacities of batteries reduce, the electric power that can be recovered through regenerative control during travel reduces, so this may lead to the deterioration of fuel consumption in hybrid vehicles. Therefore, as the deterioration of batteries progresses, the values of the vehicles decrease. Hence, the states of deterioration of batteries are matters of serious concern not only for users but also for makers of vehicles (or dealers, or the like, of used vehicles), FIG. 3 is a graph for illustrating an example of changes in the full charge capacity of the battery 60 with time. In FIG. 3 and FIG. 4 (described later), the abscissa axis represents elapsed time from time t0 of manufacture of the vehicle 1 to time tmax at which an assumed service period (for example, 15 years) of the vehicle 1 elapses. The abscissa axis may be read as elapsed time from the time of manufacture of the battery 60. The ordinate axis represents the full charge capacity of the battery 60. In FIG. 3, ampere hour (Ah) is used as the unit of the full charge capacity. Alternatively, watt hour (Wh) may be used as the unit of the full charge capacity.

FIG. 3 shows, as a comparative example, changes in the full charge capacity of the battery 60 with time in two vehicles having the identical configuration to that of the vehicle 1 shown in FIG. 1 and FIG. 2. To distinguish the two vehicles from each other, hereinafter, one of the vehicles is referred to as vehicle A, and the other one of the vehicles is referred to as vehicle B. Assume that, after the manufacture of the vehicles A, B, the vehicles A, B are delivered to users at time t1. Since travel of the vehicles A, B (charge and discharge of the batteries) begins from time t1, the progress of deterioration of the batteries gets faster just after time t1 when the progress of deterioration just before time t1 and the progress of deterioration just after time t1 are compared with each other.

The capacity retention rates of batteries are mostly used as indicators that indicate the states of deterioration of the batteries. The capacity retention rates of the batteries in the comparative example shown in FIG. 3 each are expressed by the ratio of the full charge capacity of the battery at a current point in time to the full charge capacity of the battery in an initial state (at the time of manufacture of the vehicle).

More specifically, when the current point in time is time t2, the capacity retention rate Qa of the battery mounted on the vehicle A is the ratio of the full charge capacity Ca of the battery at the current point in time (time t2) to the full charge capacity Ca0 of the battery in the initial state, and is calculated by using the following equation (1).

$$Qa = Ca/Ca0 \times 100 \qquad (1)$$

On the other hand, the capacity retention rate Qb of the battery mounted on the vehicle B is the ratio of the full charge capacity Cb of the battery at the current point in time to the full charge capacity Cb of the battery in the initial state, and is calculated by using the following equation (2).

$$Qb = Cb/Cb0 \times 100 \qquad (2)$$

However, as shown in FIG. 3, the full charge capacities Ca0, Cb0 of the batteries in the initial states can vary among the vehicles A, B because of production tolerances or other factors of the batteries (Ca0≠Cb0). For this reason, when the capacity retention rates of the batteries are compared between the vehicles A, B, even when the capacity retention rates indicate the same value (Qa=Qb), the full charge capacities of the batteries after deterioration can be different from each other (Ca≠Cb). Then, the states of deterioration of the batteries (in other words, the values of the vehicles) may not be accurately evaluated based on the capacity retention rates of the batteries.

The present embodiment employs a configuration in which a decrease in the capacity of a battery is evaluated based on the "capacity retention rate" defined differently from the above-described ordinary capacity retention rate by using a reference capacity Cref in a reference capacity curve L (see FIG. 4) set in advance and the instrument panel 80 is caused to display the evaluation result.

Calculation of Capacity Retention Rate

FIG. 4 is a graph for illustrating a technique for calculating the capacity retention rate of a battery in the present embodiment. As shown in FIG. 4, the degree of progress of deterioration of a battery can vary depending on the mode of use of the battery (such as a temperature environment in which a vehicle is placed and the mode of charge and discharge of a vehicle). The reference capacity curve L represents the degree of progress of deterioration (the degree of decrease in full charge capacity) of a battery, set in advance by design or the like.

In the present embodiment, a reference period tref that is a reference period to calculate the full charge capacity of a battery. In addition, the reference capacity Cref that is a reference capacity to calculate the full charge capacity of a battery is set in advance based on the reference capacity curve L and the reference period tref. A technique for setting the reference period tref and the reference capacity Cref will be described in detail later.

Generally, when a user purchases a new vehicle, a certain extent of period (for example, several weeks to several months) can elapse from the manufacture of the vehicle to delivery of the vehicle to the user. The reference period tref is set to longer than a period that is assumed as a period from the manufacture of a vehicle to delivery of the vehicle to a user, and may be set to, for example, one year. Therefore, in the example shown in FIG. 4, the time t1 at which the vehicles A, B are delivered to users comes before a lapse of the reference period tref.

When the deterioration of a battery progresses along the reference capacity curve L, the reference capacity Cref is calculated based on the virtual full charge capacity (virtual capacity) of the battery at the point in time at which the reference period tref elapses, and more specifically coincides with the virtual capacity at the point in time at which the reference period tref elapses. The vehicles A, B are delivered to users before the reference period tref elapses and the use of the vehicles A, B begins, so a decrease in the full charge capacities of the batteries gets faster after delivery than before delivery. Therefore, time to at which the full charge capacity of the battery of the vehicle A reaches the reference capacity Cref comes after a lapse of the reference period tref. Time tb at which the full charge capacity of the battery of the vehicle B reaches the reference capacity Cref also comes after a lapse of the reference period tref.

In the present embodiment, the thus set reference capacity Cref is commonly used to calculate the capacity retention rates Ra, Rb of all the vehicles. Specifically, at time t2 that comes after the time at which the reference period tref elapses, the capacity retention rate Ra of the battery mounted on the vehicle A is the ratio of the full charge capacity Ca of the battery at the current point in time (time t2) to the reference capacity Cref, and is calculated by using the following equation (3).

$$Ra = Ca/Cref \times 100 \qquad (3)$$

On the other hand, the capacity retention rate Rb of the battery mounted on the vehicle B is the ratio of the full charge capacity Cb of the battery at the current point in time to the reference capacity Cref, and is calculated by using the following equation (4).

$$Rb = Cb/Cref \times 100 \qquad (4)$$

In this way, since the capacity retention rates Ra, Rb are calculated by using the common reference capacity Cref, the magnitude relation between the capacity retention rates Ra, Rb coincides with the magnitude relation between the full charge capacities Ca, Cb. Therefore, the state of deterioration of a battery is accurately evaluated based on the capacity retention rate of the battery.

In addition, in the comparative example shown in FIG. 3, at the point in time (time t1) at which the vehicles A, B are delivered to users, the capacity retention rates of the batteries may be lower than the capacity retention rates (=100%) at the time of manufacture of the vehicles. Then, the users may experience a feeling of strangeness that the batteries have deteriorated from the time of delivery although the users purchased new vehicles. To deal with this inconvenience, in the present embodiment, the instrument panel 80 is caused to display the capacity retention rate calculated by using the common reference capacity Cref as follows.

Display of Capacity Retention Rate

Figure 5A:
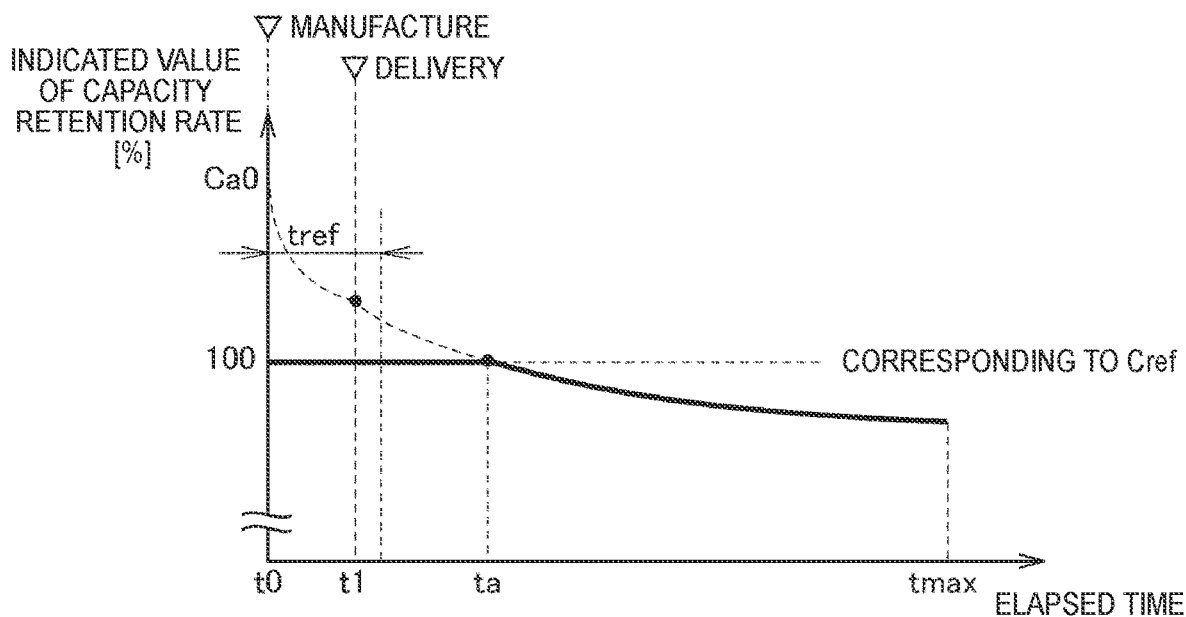
FIG. 5A is a graph for illustrating an example of display of the capacity retention rate of the battery in the present embodiment.
Figure 5B:
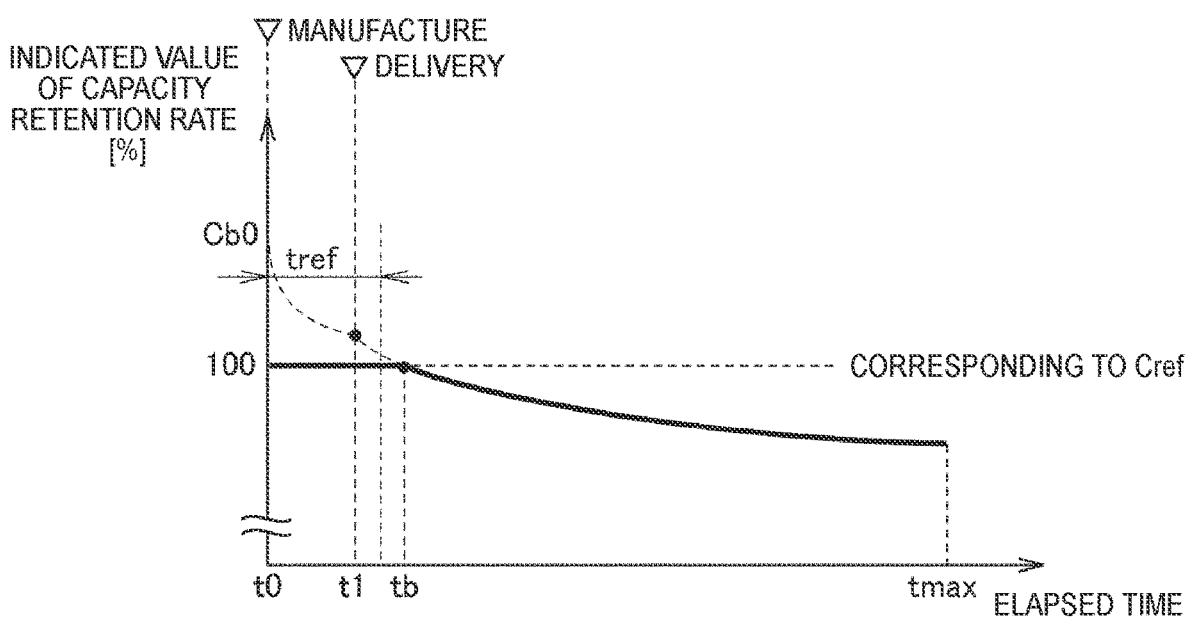
FIG. 5B is a graph for illustrating an example of display of the capacity retention rate of the battery in the present embodiment.

FIG. 5A and FIG. 5B are graphs for illustrating examples of display of the capacity retention rate of the battery in the present embodiment. FIG. 5A shows display of the capacity retention rate Ra of the battery in the vehicle A. FIG. 5B shows display of the capacity retention rate Rb of the battery in the vehicle B. In FIG. 5A and FIG. 5B, the abscissa axis represents elapsed time from time t0 of manufacture of the vehicle 1, as in the case of FIG. 3 and FIG. 4. The ordinate axis represents an indicated value of the capacity retention rate of the battery on the instrument panel 80.

As shown in FIG. 5A, in the present embodiment, the capacity retention rate Ra of the battery, which is displayed on the instrument panel 80 of the vehicle A, is kept at 100% until time ta at which the full charge capacity of the battery of the vehicle A reaches the reference capacity Cref. From time ta, the indicated value of the capacity retention rate Ra of the battery decreases with time, and becomes lower than 100%.

As shown in FIG. 5B, similarly for the vehicle B, the capacity retention rate Rb of the battery, which is displayed on the instrument panel 80 of the vehicle B, is kept at 100% until time tb at which the full charge capacity of the battery of the vehicle B reaches the reference capacity Cref. From time tb, the indicated value of the capacity retention rate Rb of the battery decreases with time.

In this way, in the present embodiment, the indicated value of the capacity retention rate is kept at 100% until time ta or time tb comes after delivery of the vehicle 1 (the vehicle A or the vehicle B) to the user. With the above configuration of the display on the instrument panel 80, the indicated value of the capacity retention rate of the battery at the point in time (time t1) at which the vehicle 1 is delivered to a user does not become lower than 100%, so a feeling of strangeness of the user as described above is reduced (eliminated).

FIG. 5A and FIG. 5B show the examples in which the capacity retention rate of the battery is fixed at 100% until time ta or time tb. Instead, the capacity retention rate calculated by using equation (3) or equation (4) may be directly displayed. That is, the capacity retention rate to be displayed on the instrument panel 80 may be higher than 100%. In this case, a value higher than 100% may be regarded as a maximum of the capacity retention rate.

Flow of Deterioration Display Processing

Figure 6:
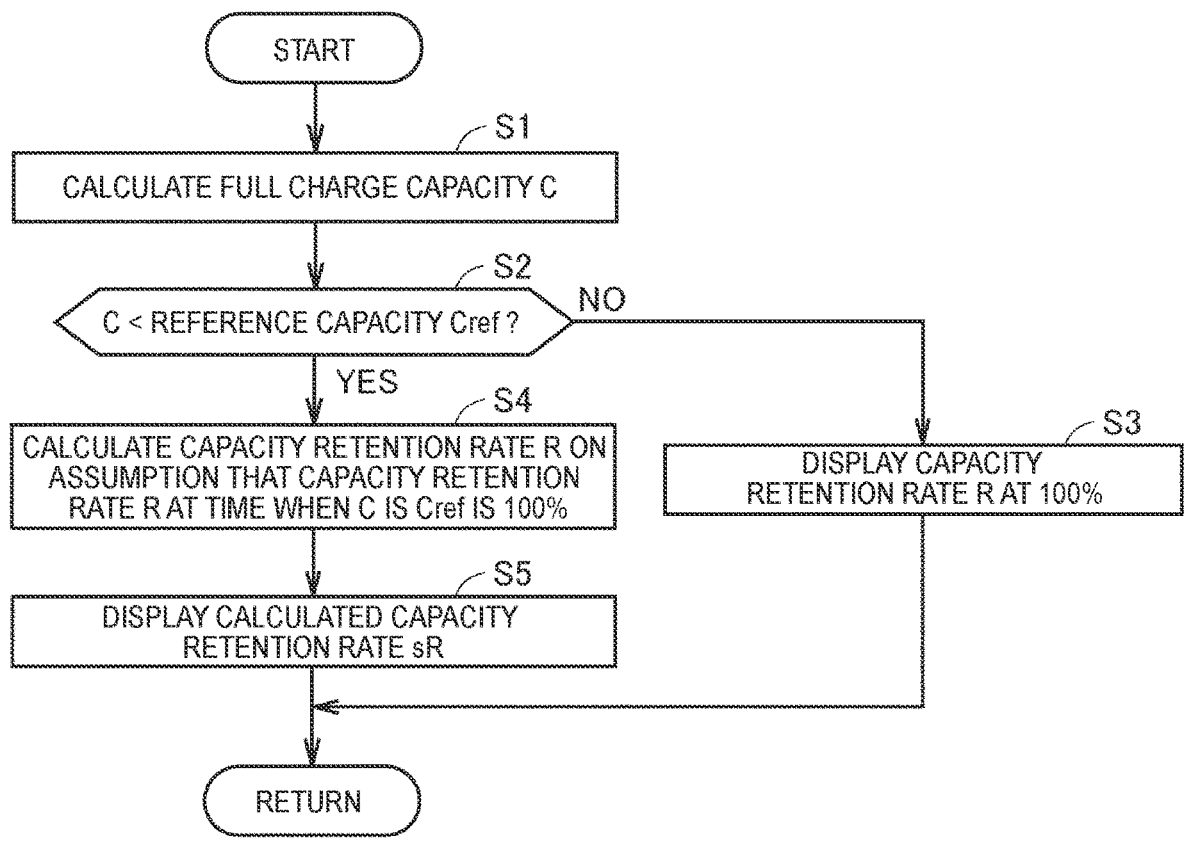
FIG. 6 is a flowchart that shows deterioration display processing in the present embodiment.

FIG. 6 is a flowchart that shows the deterioration display processing in the present embodiment. This flowchart is repeatedly executed by the ECU 100, for example, each time a predetermined period elapses. Steps (hereinafter, step is abbreviated as "S") included in the flowchart are basically implemented by the ECU 100 through software processing. Instead, the steps included in the flowchart may be implemented by exclusive hardware (electric circuit) incorporated in the ECU 100.

Referring to FIG. 6, in 51, the ECU 100 calculates the full charge capacity C of the battery 60. More specifically, the ECU 100 estimates the SOC of the battery 60 before and after the battery 60 is charged or discharged (for example, before the start of plug-in charge of the vehicle 1 and after the end of plug-in charge of the vehicle 1), and the amount of electric power ΔAh charged into or discharged from the battery 60 between the two estimations of the SOC is acquired by integrating the current using the current sensor. In this case, the ECU 100 is able to calculate the full charge capacity C of the battery 60 by using the following equation (5) based on SOC1, SOC2 that are the two results of SOC estimation processing and the amount of electric power ΔAh charged or discharged.

$$C = \Delta Ah/(SOC1 - SOC2) \times 100 \quad (5)$$

In S2, the ECU 100 determines whether the full charge capacity C calculated in S1 is lower than the reference capacity Cref. When the deterioration of the battery 60 progresses along the reference capacity curve L, the reference capacity Cref is the full charge capacity (virtual capacity) of the battery 60 at the point in time at which the reference period tref elapses, and is stored in advance in the memory of the ECU 100.

When the full charge capacity C is higher than or equal to the reference capacity Cref (NO in S2), the ECU 100 advances the process to S3, and controls the instrument panel 80 such that the capacity retention rate of the battery 60 reads 100%. In the example shown in FIG. 2, showing ten icons provides a user with the information that the battery 60 has not deteriorated at all. Alternatively, the ECU 100 may cause the instrument panel 80 to display the numeric value "100%" as the capacity retention rate of the battery 60.

In contrast to this, when the full charge capacity C becomes lower than the reference capacity Cref (YES in S2), the ECU 100 advances the process to S4, and calculates the subsequent capacity retention rate of the battery 60 on the assumption that the full charge capacity at the point in time at which the full charge capacity C reaches the reference capacity Cref is 100%. That is, the capacity retention rate R of the battery 60 is calculated by dividing the full charge capacity C of the battery 60 at the current point in time by the reference capacity Cref (see the following equation (6)).

$$R = C/Cref \times 100 \quad (6)$$

The ECU 100 causes the instrument panel 80 to display the capacity retention rate R calculated in S4 (S5). In the example shown in FIG. 2, the ECU 100 controls the display on the instrument panel 80 such that the number of icons reduces from ten as the capacity retention rate R of the battery 60 decreases. Alternatively, the ECU 100 may cause the instrument panel 80 to display a numeric value lower than 100%, calculated as the capacity retention rate of the battery 60.

The flowchart shown in FIG. 6 illustrates the example in which the ECU 100 of the vehicle 1 calculates the capacity retention rate of the battery 60. Instead, the capacity retention rate of the battery 60 may be calculated by a server (not shown) provided outside the vehicle 1. The ECU 100 of the vehicle 1 where necessary transmits parameters (various parameters included in the equation (3) and the equation (4)) for calculating the capacity retention rate of the battery 60 via the communication unit 90 to the server, and receives the calculated capacity retention rate from the server. Thus, the ECU 100 is able to cause the instrument panel 80 to display the capacity retention rate.

As described above, in the present embodiment, the capacity retention rate of the battery 60 is calculated by using the reference capacity Cref common to all the vehicles (see the equation (3) and the equation (4)). The reference (denominator) at the time of calculating a capacity retention rate is uniformized to the reference capacity Cref, so the magnitude relation of the capacity retention rate coincides with the magnitude relation of the full charge capacity. Therefore, the state of deterioration of the battery 60 is accurately evaluated through comparison based on the capacity retention rate.

The reference capacity curve L is set so as to represent the degree of progress of deterioration of the battery 60 whose full charge capacity in an initial state is sufficiently low and whose deterioration is sufficiently fast. The reference period tref is set to longer than an assumed period until the vehicle 1 is delivered to a user after the manufacture of the vehicle 1. The reference capacity Cref is set based on the reference capacity curve L and the reference period tref. Then, the full charge capacity of the battery 60 at the point in time (time t1) at which the vehicle 1 is delivered to the user is inevitably higher than the reference capacity Cref. This prevents the situation in which the capacity retention rate of the battery 60, which is displayed on the instrument panel 80, is lower than 100% at the time of delivery of the vehicle. Thus, a user who takes delivery of the vehicle 1 as a new vehicle does not see the capacity retention rate lower than 100%, so a feeling of strangeness of the user is reduced.

In the present embodiment, the example in which the instrument panel 80 is caused to display a numeric value (percent) of the capacity retention rate of the battery 60 or icons in number set according to the capacity retention rate is described. That is, the example in which the "indicator" that is displayed on the instrument panel 80 is a numeric value or icons of the capacity retention rate of the battery 60 is described. Instead, the ECU 100 may calculate the EV range of the vehicle 1 based on the capacity retention rate of the battery 60 (and the electric power consumption of the vehicle 1), and cause the instrument panel 80 to display the calculated EV range. In this case, the "indicator" that is displayed on the instrument panel 80 is the EV range of the vehicle 1.

The embodiment described above is illustrative and not restrictive in all respects. The scope of the disclosure is not defined by the description of the above-described embodiment, and is defined by the appended claims. The scope of the disclosure is intended to encompass all modifications within the scope of the appended claims and equivalents thereof.

What is claimed is:

1. A vehicle comprising:
   a secondary battery mounted on the vehicle as a power source; and
   a display device configured to display an indicator that indicates a capacity retention rate of the secondary battery at a current point in time, the capacity retention rate being a ratio of a capacity of the secondary battery at the current point in time to a reference capacity of the secondary battery, the reference capacity being set in advance based on a virtual capacity of the secondary battery after a lapse of a predetermined period from manufacture of the vehicle; wherein
   the predetermined period is set to longer than a period that is assumed until delivery of the vehicle to a user from the manufacture of the vehicle,
   the reference capacity is set based on a capacity of the secondary battery after a lapse of the predetermined period from the manufacture of the vehicle on a reference capacity curve that indicates a decrease in the capacity of the secondary battery with time, and
   wherein, before the capacity of the secondary battery reaches the reference capacity, the indicator indicates that the capacity retention rate of the secondary battery is kept at a maximum.

2. The vehicle according to claim 1, wherein the display device is configured to, after the capacity of the secondary battery reaches the reference capacity, display the indicator so as to indicate that a decrease in the capacity retention rate of the secondary battery progresses.

3. A deterioration evaluation device for a secondary battery, the secondary battery being mounted on a vehicle as a power source, the deterioration evaluation device comprising:
   a display unit configured to display an indicator that indicates a capacity retention rate of the secondary battery at a current point in time, the capacity retention rate being a ratio of a capacity of the secondary battery at the current point in time to a reference capacity of the secondary battery, the reference capacity being set in advance based on a virtual capacity of the secondary battery after a lapse of a predetermined period from manufacture of the vehicle, wherein
   the predetermined period is set to longer than a period that is assumed until delivery of the vehicle to a user from the manufacture of the vehicle,
   the reference capacity is set based on a capacity of the secondary battery after a lapse of the predetermined period from the manufacture of the vehicle on a reference capacity curve that indicates a decrease in the capacity of the secondary battery with time, and
   wherein, before the capacity of the secondary battery reaches the reference capacity, the indicator indicates that the capacity retention rate of the secondary battery is kept at a maximum.

4. A deterioration evaluation method for a secondary battery, the secondary battery being mounted on a vehicle as a power source, the deterioration evaluation method comprising:
   setting a reference capacity of the secondary battery based on a capacity of the secondary battery after a lapse of a predetermined period from manufacture of the vehicle, wherein the predetermined period is set longer than a period that is assumed until delivery of the vehicle to a user from the manufacture of the vehicle;
   setting the reference capacity based on a capacity of the secondary battery after a lapse of the predetermined period from the manufacture of the vehicle on a reference capacity curve that indicates a decrease in the capacity of the secondary battery with time; and
   displaying an indicator that indicates a capacity retention rate of the secondary battery at a current point in time on a display unit, the capacity retention rate being a ratio of a capacity of the secondary battery at the current point in time to the reference capacity of the secondary battery, wherein,
   before the capacity of the secondary battery reaches the reference capacity, the indicator indicates that the capacity retention rate of the secondary battery is kept at a maximum.

\* \* \* \* \*